(12) United States Patent
Pawlak et al.

(10) Patent No.: US 12,339,494 B2
(45) Date of Patent: Jun. 24, 2025

(54) EDGE COUPLERS WITH A FINE-ALIGNMENT MECHANISM

(71) Applicant: GlobalFoundries U.S. Inc., Malta, NY (US)

(72) Inventors: Bartlomiej Jan Pawlak, Leuven (BE); Oscar D. Restrepo, Halfmoon, NY (US); Koushik Ramachandran, Wappingers Falls, NY (US); Yusheng Bian, Ballston Lake, NY (US); Eduardo Cruz Silva, Watervliet, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 290 days.

(21) Appl. No.: 18/093,039

(22) Filed: Jan. 4, 2023

(65) Prior Publication Data
US 2024/0219636 A1    Jul. 4, 2024

(51) Int. Cl.
*G02B 6/122* (2006.01)
*G02B 6/12* (2006.01)
*G02B 6/13* (2006.01)

(52) U.S. Cl.
CPC .............. *G02B 6/1228* (2013.01); *G02B 6/13* (2013.01); *G02B 2006/12121* (2013.01)

(58) Field of Classification Search
CPC ........ G02B 6/3596; G02B 6/136; G02B 6/13; G02B 6/3576; G02B 6/3566; G02B 6/1228; G02B 6/3502
See application file for complete search history.

(56) References Cited

U.S. PATENT DOCUMENTS

| 6,559,464 | B1 | 5/2003 | Flanders et al. |
| 10,895,702 | B2 | 1/2021 | Yasumura et al. |
| 11,320,718 | B1* | 5/2022 | Mahmoud ............ G02B 6/3596 |
| 2004/0184710 | A1* | 9/2004 | Kubby ................... G02B 6/358 385/16 |
| 2005/0167508 | A1 | 8/2005 | Syms et al. |
| 2019/0369328 | A1* | 12/2019 | Davies .................... H01S 5/026 |

FOREIGN PATENT DOCUMENTS

WO    2010082524 A1    7/2010

OTHER PUBLICATIONS

European Patent Office, Extended European Search Report and Opinion issued in European Patent Application No. 23204241.6 on Apr. 24, 2024; 10 pages.

(Continued)

*Primary Examiner* — Michael P Mooney
(74) *Attorney, Agent, or Firm* — Thompson Hine LLP; Anthony Canale

(57) ABSTRACT

Structures including an edge coupler and methods of forming such structures. The structure comprises a dielectric layer on a semiconductor substrate. The dielectric layer includes a cavity and an edge defining a boundary of the cavity. The structure further comprises an edge coupler including a waveguide core. The waveguide core includes a portion that extends past the edge of the dielectric layer and overhangs the cavity. The structure further comprises a heater positioned adjacent to the portion of the waveguide core. The heater is spaced by a gap from the portion of the waveguide core.

20 Claims, 3 Drawing Sheets

(56) References Cited

OTHER PUBLICATIONS

Peters T.J. et al., "Electrothermal Actuators for SiO2 Photonic MEMS", Micromachines, vol. 7, No. 11, Nov. 7, 2016, pp. 1-20.

Sharma S. et al., "Integrated 1x3 MEMS silicon nitride photonics switch", Optics Express 22200, vol. 30, No. 12, Jun. 6, 2022, pp. 1-21.

"Hybrid Laser Integration"—IMEC technical update presentation for GF, 53 pages (Mar. 29, 2021).

Peter Hidnert and W.T. Sweeney, "Thermal Expansion of Tungsten." Scientific Papers of the Bureau of Standards, vol. 20, pp. 483-487 (Aug. 17, 1925).

A. Masood et al., "CMOS-compatible Tungsten heaters for silicon photonic waveguides," The 9th International Conference on Group IV Photonics (GFP), 2012, pp. 234-236, doi: 10.1109/GROUP4.2012.6324144.

K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, doi: 10.1109/JSTQE.2019.2908790.

Peng Sun and Ronald M. Reano, "Cantilever couplers for intra-chip coupling to silicon photonic integrated circuits," Optics Express 17, 4565-4574 (2009).

Y. Bian et al., "3D Integrated Laser Attach Technology on 300-mm Monolithic Silicon Photonics Platform," 2020 IEEE Photonics Conference (IPC), 2020, pp. 1-2, doi: 10.1109/IPC47351.2020.9252280.

Y. Bian et al., "Hybrid III-V laser integration on a monolithic silicon photonic platform," in Optical Fiber Communication Conference (OFC) 2021, P. Dong, J. Kani, C. Xie, R. Casellas, C. Cole, and M. Li, eds., OSA Technical Digest (Optica Publishing Group, 2021), paper M5A.2.

\* cited by examiner

EDGE COUPLERS WITH A FINE-ALIGNMENT MECHANISM

BACKGROUND

The disclosure relates to photonics chips and, more specifically, to structures including an edge coupler and methods of forming such structures.

Photonics chips are used in many applications and systems including, but not limited to, data communication systems and data computation systems. A photonics chip integrates optical components and electronic components into a unified platform. Among other factors, layout area, cost, and operational overhead may be reduced by the integration of both types of components on the same chip.

An edge coupler, also known as a spot-size converter, is an optical component that is commonly used for coupling light of a given mode from a light source, such as a laser or an optical fiber, to other optical components on the photonics chip. The edge coupler may include a section of a waveguide core that defines an inverse taper having a tip. In the edge coupler construction, the narrow end of the inverse taper provides a facet at the tip that is positioned adjacent to the light source, and the wide end of the inverse taper is connected to another section of the waveguide core that routes the light to the optical components of the photonics chip.

The gradually-varying cross-sectional area of the inverse taper supports mode transformation and mode size variation associated with mode conversion when light is transferred from the light source to the edge coupler. The tip of the inverse taper is unable to fully confine the incident mode received from the light source because the cross-sectional area of the tip is considerably smaller than the mode size. Consequently, a significant percentage of the electromagnetic field of the incident mode is distributed about the tip of the inverse taper. As its width increases, the inverse taper can support the entire incident mode and confine the electromagnetic field.

Improved structures including an edge coupler and methods of forming such structures are needed.

SUMMARY

In an embodiment of the invention, a structure comprises a dielectric layer on a semiconductor substrate. The dielectric layer includes a cavity and an edge defining a boundary of the cavity. The structure further comprises an edge coupler including a waveguide core. The waveguide core includes a portion that extends past the edge of the dielectric layer and overhangs the cavity. The structure further comprises a heater positioned adjacent to the portion of the waveguide core. The heater is spaced by a gap from the portion of the waveguide core.

In an embodiment of the invention, a method comprises forming a cavity in a dielectric layer that is disposed on a semiconductor substrate. The dielectric layer includes an edge defining a boundary of the cavity. The method further comprises forming an edge coupler including a waveguide core. The waveguide core includes a portion that extends past the edge of the dielectric layer and overhangs the cavity. The method further comprises forming a heater positioned in a lateral direction adjacent to the portion of the waveguide core. The heater is spaced by a gap from the portion of the waveguide core.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
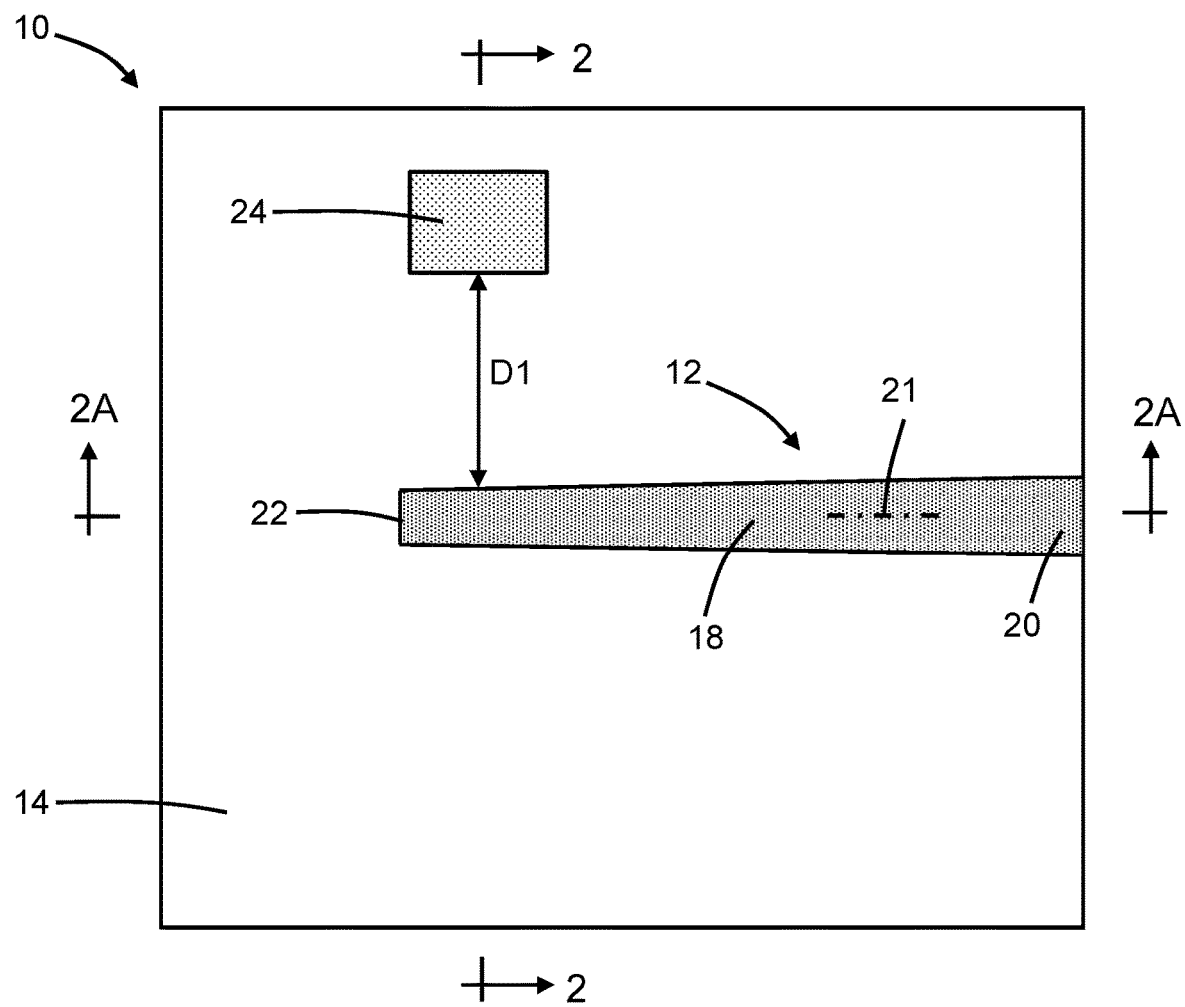
FIG. 1 is a top view of a structure at an initial fabrication stage of a processing method in accordance with embodiments of the invention.
Figure 2:
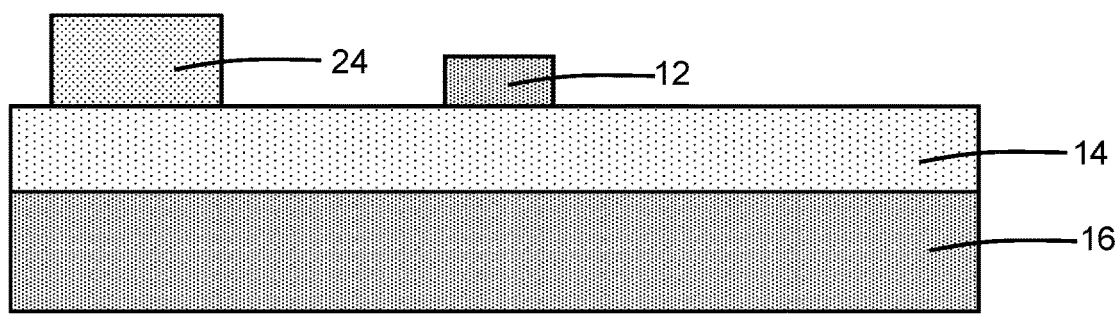
FIG. 2 is a cross-sectional view taken generally along line 2-2 in FIG. 1.
Figure 2A:
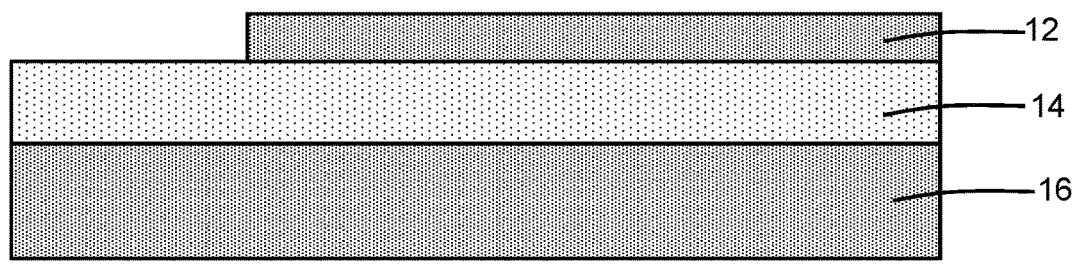
FIG. 2A is a cross-sectional view taken generally along line 2A-2A in FIG. 1.

With reference to FIGS. 1, 2, 2A and in accordance with embodiments of the invention, a structure 10 for an edge coupler includes a waveguide core 12 that is positioned over a dielectric layer 14 and a semiconductor substrate 16. In an embodiment, the dielectric layer 14 may be comprised of a dielectric material, such as silicon dioxide, and the semiconductor substrate 16 may be comprised of a semiconductor material, such as single-crystal silicon. In an embodiment, the dielectric layer 14 may be a buried oxide layer of a silicon-on-insulator substrate, and the dielectric layer 14 may fully separate the waveguide core 12 from the semiconductor substrate 16. In an alternative embodiment, one or more additional dielectric layers comprised of, for example, silicon dioxide may be positioned between the waveguide core 12 and the dielectric layer 14.

The waveguide core 12 may include a tapered section 18, a section 20 connected to the tapered section 18, and an end surface 22 that terminates the tapered section 18. The tapered section 18 and the section 20 of the waveguide core 12 may be aligned along a longitudinal axis 21. The tapered section 18 may increase in width with increasing distance along the longitudinal axis 21 from the end surface 22. The section 20 of the waveguide core 12 may be connected to other optical components. In an alternative embodiment, another tapered section with a different taper angle may be adjoined to the tapered section 18 to define a compound taper. In embodiments, the waveguide core 12 may have a width of about 500 nanometers to 1000 nanometers and a height of about 500 nanometers to 1000 nanometers.

In an embodiment, the waveguide core 12 may be comprised of a material having a refractive index that is greater than the refractive index of silicon dioxide. In an embodiment, the waveguide core 12 may be comprised of a semiconductor material, such as single-crystal silicon or polysilicon. In an embodiment, the waveguide core 12 may be formed by patterning a layer comprised of the constituent material with lithography and etching processes. In an embodiment, an etch mask may be formed by a lithography process over a layer of the constituent material, and unmasked sections of the layer may be etched by an etching process. The shape of the etch mask determines the patterned shape of the waveguide core 12. In an embodiment, the waveguide core 12 may be formed by patterning the semiconductor material (e.g., single-crystal silicon) of a device layer of a silicon-on-insulator substrate. In an embodiment, the waveguide core 12 may be formed by depositing a layer comprised of the constituent material (e.g., polysilicon) and patterning the deposited layer.

The structure 10 may include an alignment-adjustment mechanism in the form of a heater 24 that is positioned adjacent to the waveguide core 12. More specifically, the heater 24 may be positioned adjacent to the tapered section 18 of the waveguide core 12 and spaced from the tapered section 18. The heater 24 may be separated from the tapered section 18 of the waveguide core 12 by a gap having a dimension D1. The heater 24 may be comprised of a metal, such as tungsten, that is deposited and patterned to shape by lithography and etching processes. Alternatively, the heater 24 may be comprised of a different metal that is also characterized by a similarly high coefficient of thermal expansion. In an embodiment, the heater 24 may have a width on the order of 50 microns and a length on the order of 300 microns, and the dimension D1 may range from about 2 microns to about 3 microns.

Figure 3:
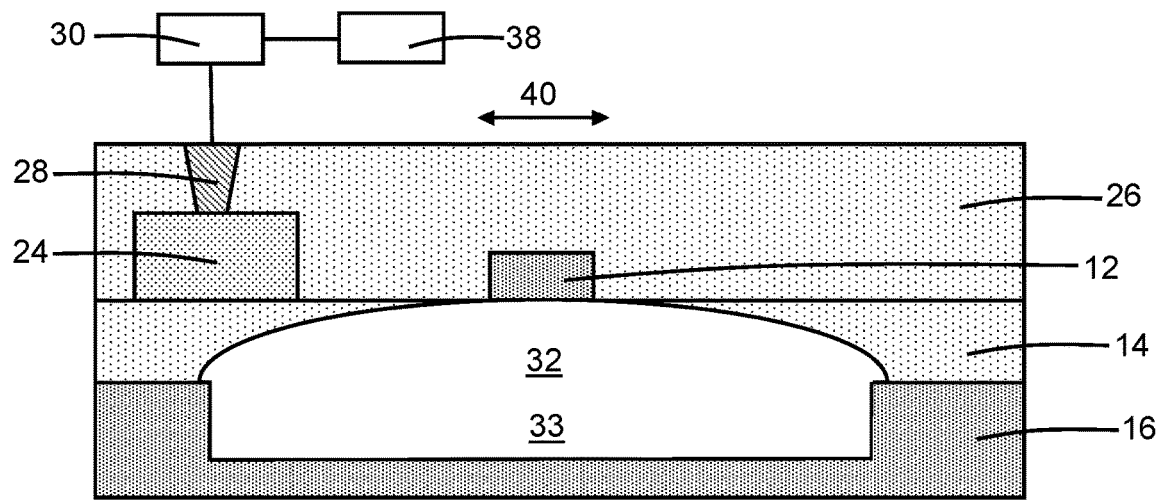
FIGS. 3, 3A are cross-sectional views of the structure at a fabrication stage of the processing method subsequent to FIGS. 2, 2A.
Figure 3A:
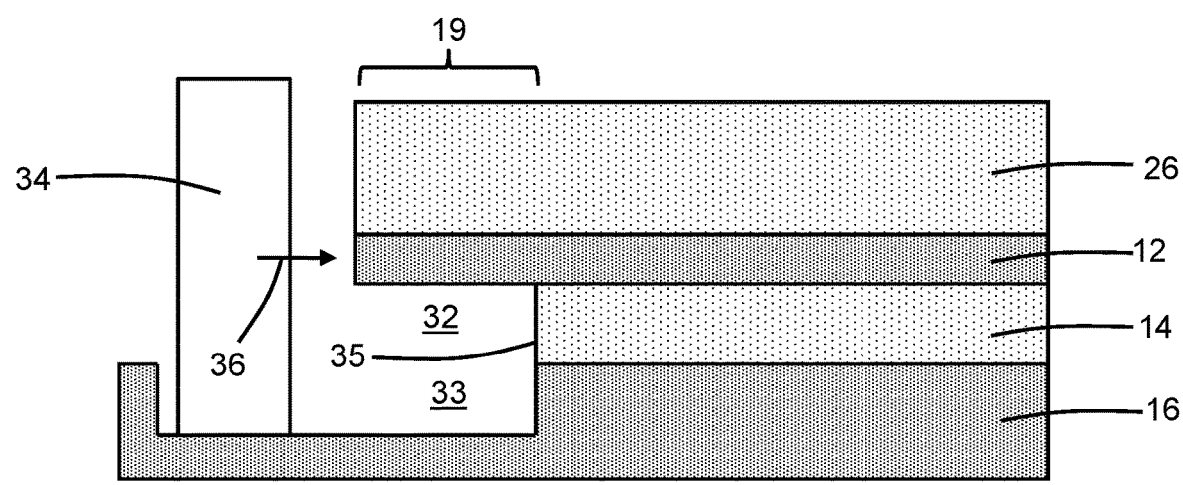

With reference to FIGS. 3, 3A in which like reference numerals refer to like features in FIGS. 2, 2A and at a subsequent fabrication stage, a dielectric layer 26 may be formed over the waveguide core 12 and heater 24. The dielectric layer 26 may be comprised of a dielectric material, such as silicon dioxide, having a refractive index that is less than the refractive index of the material constituting the waveguide core 12. The dielectric layer 26 may be deposited and planarized following deposition. Portions of the dielectric layer 26 fill the gap between the heater 24 and the waveguide core 12 with dielectric material.

Contacts 28, which are formed in the dielectric layer 26, may be physically and electrically connected to the heater 24. The contacts 28 may be comprised of a metal, such as tungsten, that is deposited in openings patterned in the dielectric layer 26. The contacts 28 may connect the heater 24 with a power source 30 that can be operated to supply a current that causes Joule heating of the heater 24 such that the heater 24 can expand in size with the temperature increase.

A cavity 32 may be formed in the dielectric layer 14, and a cavity 33 may be formed in the semiconductor substrate 16. The cavity 33 may be formed in the semiconductor substrate 16 by one or more wet etching processes. The cavity 32 may be formed by a wet etching process that is performed following the formation of the cavity 33, and the cavities 32, 33 may adjoin to define a continuous and unitary cavity. The cavity 33 is arranged between the cavity 32 and the semiconductor substrate 16. The dielectric layer 14 has an edge 35 that borders the cavity 32 and thereby defines a boundary of the cavity 32 that is located beneath an undercut portion 19 of the tapered section 18 of the waveguide core 12. The undercut portion 19 of the tapered section 18 of the waveguide core 12 extends past the edge 35 of the dielectric layer 14 and overhangs the cavities 32, 33 adjacent to the edge 35 of the dielectric layer 14. In an embodiment, the overhang distance of the undercut portion 19 of the tapered section 18 relative to the edge 35 may be approximately two microns.

In an embodiment, at least a portion of the bottom surface of the undercut portion 19 of waveguide core 12 may adjoin the cavity 32. The cavity 32, which communicates with the cavity 33, relaxes the mechanical constraint imposed on the undercut portion 19 of the tapered section 18 of the waveguide core 12. The heater 24 is disposed on the dielectric layer 14. In an embodiment, the heater 24 may be disposed on the dielectric layer 14 at least in part over the cavity 32.

In an embodiment, the heater 24 may be disposed on the dielectric layer 14 fully over the cavity 32.

A laser chip 34 may be disposed inside the cavity 33. The shape and dimensions of the cavity 33 may be correlated with the shape and dimensions of the laser chip 34 such that the laser chip 34 can be inserted into the cavity 33. In that regard, the dimensions of the cavity 33 may be slightly greater than the dimensions of the laser chip 34 to provide clearance for insertion into the cavity 33. The end surface 22 of the tapered section 18 of the waveguide core 12 may be positioned adjacent to an output 36 for laser light from the laser chip 34. In an embodiment, the output 36 from the laser chip 34 may be aligned with the end surface 22 of the tapered section 18 of the waveguide core 12. In an alternative embodiment, the laser chip 34 may be replaced by a different type of light source, such as a semiconductor optical amplifier. In an alternative embodiment, the laser chip 34 may be replaced by a different type of light source, such as an optical fiber, and the cavity 33 may have a compatible shape of a V-groove formed by an etching process characterized by an etch rate that varies with crystalline orientation.

In an embodiment, the laser chip 34 may be a hybrid laser that is configured to emit laser light of a given wavelength, intensity, mode shape, and mode size. In an embodiment, the laser chip 34 may include a laser comprised of III-V compound semiconductor materials. In an embodiment, the laser chip 34 may include an indium phosphide/indium-gallium-arsenic phosphide laser that is configured to generate continuous laser light in an infrared wavelength range for emission from the output 36. For example, the laser included in the laser chip 34 may generate and output laser light from the output 36 at a nominal peak wavelength of 1310 nm or at a nominal peak wavelength of 1550 nm.

The laser chip 34 may have the form of a flip-chip package that is externally assembled and attached to the photonics chip by solder balls or bumps to provide a fixed position. The flip-chip attachment process may include inserting the laser chip 34 into the cavity 33 and reflowing the solder in the solder balls or bumps. The laser chip 34 may contact with the mechanical stops, after attachment, that provide passive alignment of the attached laser chip 34 in a vertical direction. In an embodiment, the tapered section 18 of the waveguide core 12 may be longitudinally aligned with the light emitted from the output 36 from the laser chip 34. Following assembly by flip-chip attachment, the position of the laser chip 34 is fixed.

In use, laser light may be supplied from the output 36 of the laser chip 34 to the tapered section 18 of waveguide core 12. The power source 30 is operated to supply a current to the heater 24 that causes Joule heating of the heater 24, which expands in size due to the temperature increase and positive coefficient of thermal expansion. The thermal expansion in size or dimensions of the heater 24 is transferred through the dielectric layer 26 to the undercut portion 19 of the tapered section 18 of the waveguide core 12. The undercut portion 19 of the tapered section 18 of the waveguide core 12 may bend in a lateral direction, as diagrammatically shown by the double-headed arrow 40. The bending of the undercut portion 19 of the tapered section 18 of the waveguide core 12 may be used to adjust the lateral alignment of the output 36 of the laser chip 34 with the end surface 22 of the waveguide core 12. In an embodiment, the lateral bending may reposition the end surface 22 in a lateral direction by a distance of less than or equal to one micron. A logic feedback loop 38 may be used to adjust the lateral position of the undercut portion 19 of the tapered section 18 of the waveguide core 12 for maximizing the laser power input to the edge coupler during the alignment process. The logic feedback loop 38, which is coupled to the power source 30, may sample the laser power using an on-chip photodetector, as the position is adjusted, and provide control signals to the power source 30 for changing the current supplied to the heater 24. The heater 24 responds to the associated temperature change by changing its dimensions. In an embodiment, the laser chip 34 may be intentionally misaligned when mounted inside the cavity 33 during assembly, and current may be continuously supplied from the power source 30 to the heater 24 in order to provide a constant amount of lateral bending that corrects the intentional misalignment.

The alignment mechanism provides active fine-alignment adjustment that overcomes an inability to adjust the alignment of the output 36 of the laser chip 34 with the waveguide core 12 due to the fixed post-assembly position of the laser chip 34 inside the cavity 33. For example, misalignment that occurs due to aging during post-assembly operation may be compensated by changing the current supplied from the power source 30 to the heater 24 such that the lateral bending of the tapered section 18 of the waveguide core 12 is altered.

Figure 4:
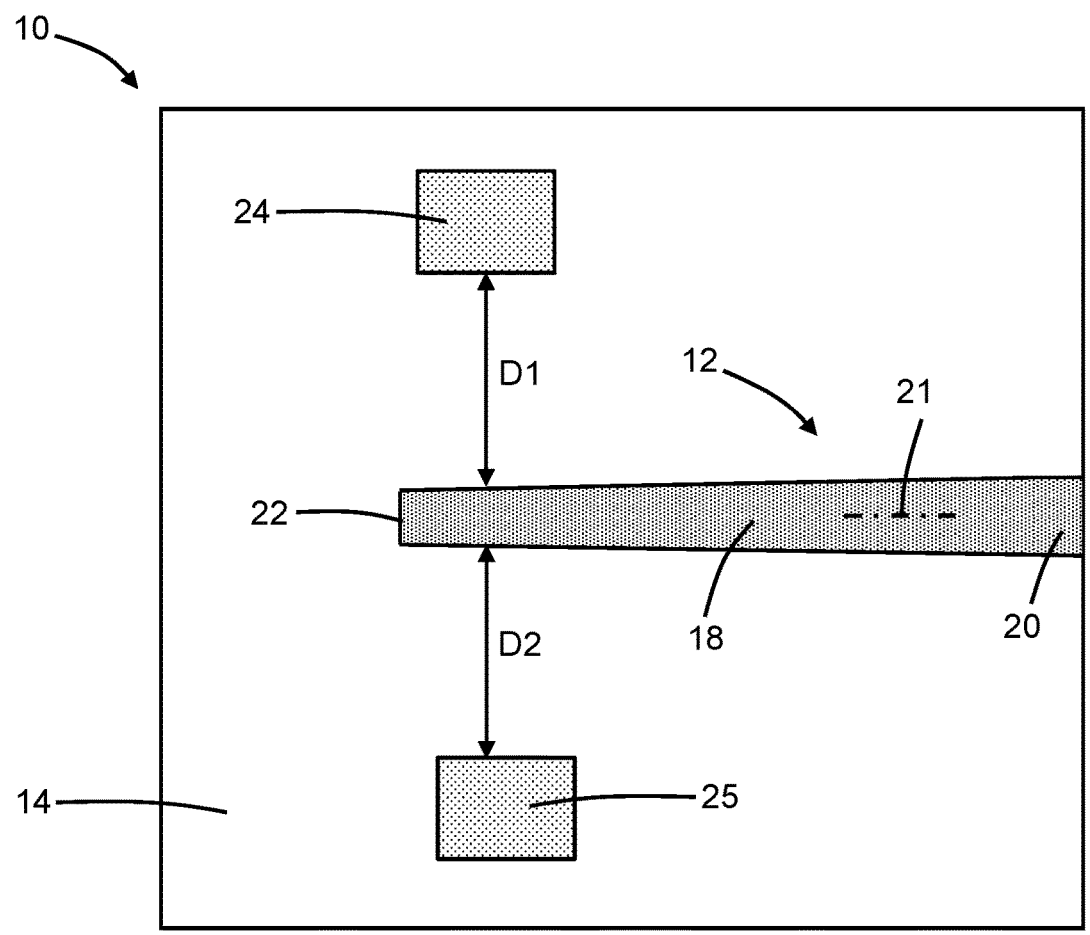
FIG. 4 is a top view of a structure in accordance with alternative embodiments of the invention.

With reference to FIG. 4 and in accordance with alternative embodiments, the alignment-adjustment mechanism of the structure 10 may modified to include another heater 25 that is positioned adjacent to the waveguide core 12. More specifically, the heater 25 may be positioned adjacent to the undercut portion 19 of the tapered section 18 of the waveguide core 12, and the undercut portion 19 of the tapered section 18 may be located in a lateral direction between the heater 24 and the heater 25. The heater 25 is separated from the undercut portion 19 of the tapered section 18 by a gap having a dimension D2. In an embodiment, the dimension D2 of the gap between the undercut portion 19 of the tapered section 18 and the heater 25 may be equal to the dimension D1 of the gap between the undercut portion 19 of the tapered section 18 and the heater 24 such that the heaters 24, 25 are symmetrically placed relative to the undercut portion 19 of the tapered section 18. The heater 25 may be comprised of a metal, such as tungsten, that is deposited and patterned by lithography and etching processes. The heater 25 may be disposed on the dielectric layer 14 and at least in part over the cavity 32.

Figure 5:
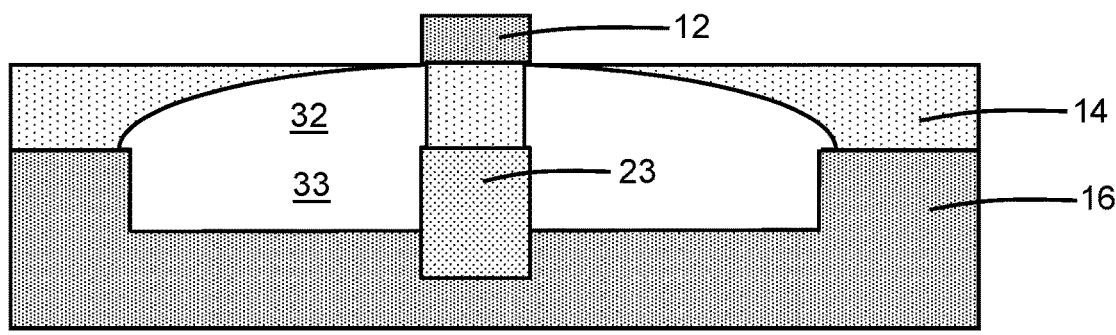
FIG. 5 is a cross-sectional view of a structure in accordance with alternative embodiments of the invention.

With reference to FIG. 5 and in accordance with alternative embodiments, a heater 23 similar to the heaters 24, 25 may be disposed at an elevation below the undercut portion 19 of the tapered section 18 of the waveguide core 12. In particular, the heater 23 may be disposed in the cavity 33 in the semiconductor substrate 16 and located beneath the undercut portion 19 of the tapered section 18. A section of the dielectric layer 14 may be disposed in a vertical direction between the heater 23 and the undercut portion 19 of the tapered section 18. The section of the dielectric layer 14, which is disposed in the cavity 32, may extend from the edge 35 parallel to the longitudinal axis 21 of the waveguide core 12 and beneath the undercut portion 19 of the tapered section 18. The heater 23 is separated in a vertical direction from the undercut portion 19 of the tapered section 18 by a gap that is filled by the dielectric material of the section of the dielectric layer 14. In an embodiment, the dimension of the gap may be equal or substantially equal to the thickness of the dielectric layer 14.

The heater 23, upon dimensional expansion from a temperature increase induced by heating, may be operative to bend the undercut portion 19 of the tapered section 18. In an embodiment, the bending due to the thermal expansion of the size of the heater 23 may primarily include a vertical component. The heater 23 may be used in combination with the heater 24, in combination with both heaters 24, 25, to provide bending to adjust the alignment of the output 36 of the laser chip 34 with the end surface 22 of the tapered section 18 of the waveguide core 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate;

a first dielectric layer on the semiconductor substrate, the first dielectric layer including a first cavity and an edge defining a boundary of the first cavity;

an edge coupler including a waveguide core, the waveguide core including an undercut portion that extends past the edge of the first dielectric layer and overhangs the first cavity, and the undercut portion including a bottom surface that adjoins the first cavity; and a first heater positioned adjacent to the undercut portion of the waveguide core, the first heater spaced by a first gap from the undercut portion of the waveguide core.

2. The structure of claim 1 wherein the first heater is positioned in a lateral direction adjacent to the undercut portion of the waveguide core.

3. The structure of claim 2 further comprising:

a second heater positioned in the lateral direction adjacent to the undercut portion of the waveguide core, the second heater spaced by a second gap from the undercut portion of the waveguide core.

4. The structure of claim 3 wherein the second gap is equal to the first gap.

5. The structure of claim 3 wherein the first heater and the second heater are each positioned at least in part over the first cavity.

6. The structure of claim 3 wherein the first heater and the second heater are each positioned on the first dielectric layer.

7. The structure of claim 1 wherein the waveguide core has an end surface, and further comprising:

a light source positioned adjacent to the end surface of the waveguide core, the light source having a light output configured to provide light in a mode propagation direction toward the undercut portion of the waveguide core.

8. The structure of claim 7 wherein the light source is a laser chip that includes a semiconductor laser.

9. The structure of claim 8 wherein the first heater is configured to expand in dimensions in response to being powered such that the undercut portion of the waveguide core bends relative to the light output.

10. The structure of claim 1 further comprising:

a second dielectric layer over the waveguide core and the first heater, the second dielectric layer comprising a dielectric material, and the dielectric material filling the first gap between the first heater and the waveguide core.

11. The structure of claim 1 wherein the first heater is disposed at least in part over the first cavity.

12. The structure of claim 1 wherein the first heater is fully disposed over the first cavity.

13. The structure of claim 1 wherein the first heater is positioned on the first dielectric layer.

14. The structure of claim 1 wherein the first heater is positioned beneath the undercut portion of the waveguide core.

15. The structure of claim 14 further comprising:

a second heater positioned in a lateral direction adjacent to the undercut portion of the waveguide core, the second heater spaced by a second gap from the undercut portion of the waveguide core.

16. The structure of claim 1 wherein the semiconductor substrate includes a second cavity disposed beneath the first cavity and the undercut portion of the waveguide core.

17. The structure of claim 16 wherein the second cavity adjoins the first cavity.

18. The structure of claim 1 wherein the undercut portion of the waveguide core is a tapered section.

19. The structure of claim 1 wherein the waveguide core comprises single-crystal silicon or polysilicon, and the first heater comprises tungsten.

20. A method comprising:

forming a cavity in a dielectric layer that is disposed on a semiconductor substrate, wherein the dielectric layer includes an edge defining a boundary of the cavity;

forming an edge coupler including a waveguide core, wherein the waveguide core includes an undercut portion that extends past the edge of the dielectric layer and overhangs the cavity, and the undercut portion includes a bottom surface that adjoins the cavity; and forming a heater positioned in a lateral direction adjacent to the undercut portion of the waveguide core, wherein the heater is spaced by a gap from the undercut portion of the waveguide core.

* * * * *